United States Patent [19]

Mrazek et al.

[11] 4,194,131
[45] Mar. 18, 1980

[54] TRISTATE LOGIC BUFFER CIRCUIT WITH ENHANCED DYNAMIC RESPONSE

[75] Inventors: Dale A. Mrazek, Los Altos Hills; Robert M. Reinschmidt, Sunnyvale, both of Calif.

[73] Assignee: National Semiconductor Corporation, Santa Clara, Calif.

[21] Appl. No.: 910,383

[22] Filed: May 30, 1978

[51] Int. Cl.$^2$ .................... H03K 3/29; H03K 19/08
[52] U.S. Cl. .................... 307/209; 307/317 A; 307/270; 307/299 A
[58] Field of Search .......... 307/209, 289, 270, 254, 307/299 A, 309, 296, 317 A

[56] References Cited
U.S. PATENT DOCUMENTS

| 3,602,733 | 8/1971 | Aoki | 307/209 |
| 3,792,292 | 2/1974 | Priel | 307/209 |
| 4,081,695 | 3/1978 | Allen et al. | 307/209 |

Primary Examiner—Stanley D. Miller, Jr.
Assistant Examiner—B. P. Davis
Attorney, Agent, or Firm—Brown & Martin

[57] ABSTRACT

A current mirror transistor is included in a tristate logic buffer circuit, with its base and emitter respectively connected to the base and emitter of the phase splitter transistor and its collector connected to the voltage supply terminal. The emitter size of the current mirror transistor is a multiple of the emitter size of the phase splitter transistor. A high resistance connected between the voltage supply terminal and the collector of the phase splitter transistor provides lower power consumption when the circuit is disabled; and the current mirror transistor supplements the drive current provided by the phase splitter transistor when the circuit is not disabled.

2 Claims, 2 Drawing Figures

TRISTATE LOGIC BUFFER CIRCUIT WITH ENHANCED DYNAMIC RESPONSE

CROSS REFERENCE TO RELATED APPLICATION

This application is related to an application Ser. No. 910384 entitled "Tristate Logic Buffer Circuit With Reduced Power Consumption" filed on even date herewith by Dale Allen Mrazek, one of the co-inventors named herein.

BACKGROUND OF THE INVENTION

The present invention is generally directed to tristate logic buffer circuits and is particularly directed to enhancing the dynamic response of such a circuit when providing a "high" logic level in the digital data output signal of the circuit.

A typical prior art tristate logic buffer circuit is shown in FIG. 1. This circuit includes an input transistor Q1, a phase splitter transistor Q2, a pull-down output transistor Q3, a pull-up transistor Q4, a current amplifying transistor Q5, first resistance R1, a second resistance R2, a third resistance R3, a fourth resistance R4, a fifth resistance R5, a diode D1 and an inverter 10. The circuit also has a data input terminal 12, a data output terminal 14, a circuit disable terminal 16, and a circuit control terminal 18.

The input transistor Q1 is a multi-emitter transistor, having a first emitter connected to the data input terminal 12 for receiving a digital data input signal. The first resistance R1 couples the base of the input transistor Q1 to the voltage supply terminal $V_{cc}$. The phase splitter transistor Q2 has its base coupled to the collector of the input transistor Q1. The second resistance R2 couples the collector of the phase splitter transistor Q2 to the voltage supply terminal $V_{cc}$. The pull-down output transistor Q3 has its base coupled to the emitter of the phase splitter transistor Q2, its emitter coupled to a circuit ground terminal, and its collector connected to the data output terminal 14. The third resistance R3 is connected between the base and emitter of the pull-down output transistor Q3. The pull-up output transistor Q4 has its emitter connected to the data output terminal 14, its collector coupled through the resistance R4 to the voltage supply terminal $V_{cc}$ and its base coupled through the current amplifying transistor Q5 to the collector of the phase splitter transistor Q2. The current amplifying transistor Q5 has its emitter connected to the base of the pull-up output transistor Q4, its base connected to the collector of the phase splitter transistor Q2, and its collector connected to the collector of the pull-up output transistor Q4. Resistance R5 is connected between the base of the pull-up output transistor Q4 and circuit ground.

The circuit disable terminal 16 is connected to a second emitter of the input transistor Q1, and is coupled to the circuit control 18 terminal through the inverter 10. The diode D1 has its anode connected to the collector of the phase splitter transistor Q2 and its cathode connected to the circuit disable terminal 16. The circuit is disabled when a "high" logic signal is applied to the circuit control terminal 18, whereby the inverter 10 causes a "low" logic signal to be applied at the circuit disable terminal 16.

When a "high" logic signal is applied at the circuit disable terminal 16, a digital data output signal that is the logical complement of the digital data input signal at input terminal 12, is provided at the data output terminal 14. When a "low" logic signal is applied at the circuit disable terminal 16, the circuit has a high output impedance between the data output terminal 14 and circuit to inhibit the provision of the digital data output signal at the output terminal 14.

It is an object of the present invention to enhance the dynamic response of the pull-up output transistor in providing a "high" logic level digital data output signal.

SUMMARY OF THE INVENTION

The present invention is an improved tristate logic buffer circuit which is characterized by a current mirror transistor having its base and emitter respectively connected to the base and emitter of the pull-up output transistor and its collector connected to the voltage supply terminal. The ratio of the emitter size of the current mirror transistor to the emitter size of the pull-up output transistor is scaled in accordance with how much current is required to drive the pull-up output transistor.

The addition of the second current mirror transistor enhances the dynamic response of the pull-up output transistor in providing a "high" logic level in the digital data output signal at the data output terminal. Whereas there is a Miller feedback effect on the pull-up output transistor which has its collector coupled to the supply voltage terminal through a resistance; there is minimal Miller feedback effect upon the current mirror transistor which has its collector connected directly to the voltage supply terminal.

Thus upon the onset of a positive transition in the signal at the bases of the current mirror transistor and the pull-up output transistor, the current ratio between the current mirror transistor and the pull-up output transistor is even greater than the ratio of their respective emitter sizes and the dynamic response of the pull-up output transistor in providing a high logic level in the digital data output signal at the data output terminal is enhanced.

Additional features of the present invention are described in the description of the preferred embodiment.

DESCRIPTION OF THE PREFERRED EMBODIMENT

Figure 2:
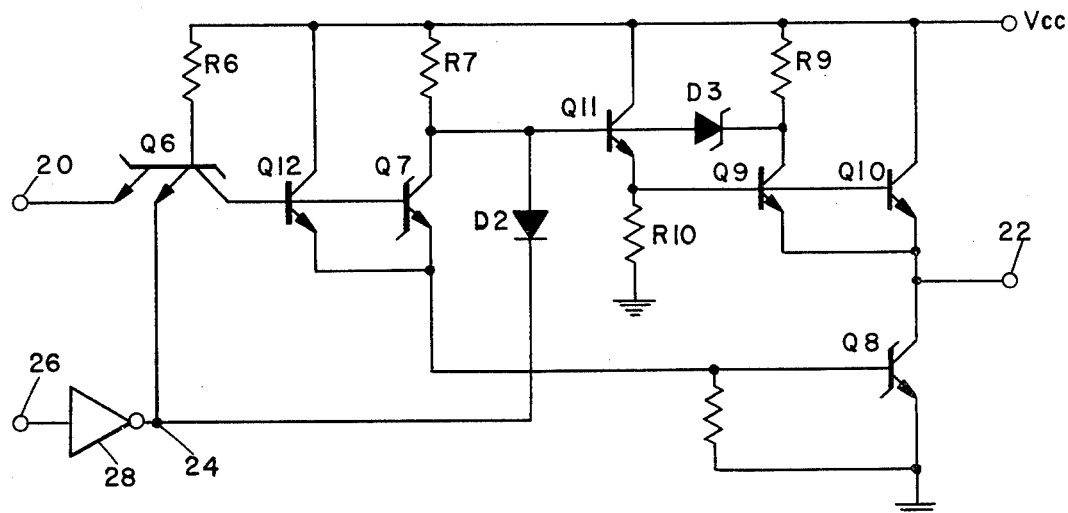
FIG. 2 is a schematic circuit diagram of a preferred embodiment of a tristate logic buffer circuit according to the present invention.

Referring to FIG. 2, a tristate logic buffer circuit according to the present invention includes a multi-emitter input transistor Q6, a phase splitter transistor Q7, a pull-down output transistor Q8, a pull-up output transistor Q9, a current mirror transistor Q10, a current amplifying transistor Q11, and a second current mirror transistor Q12.

A first resistance R6 is connected between the base of the input transistor Q6 and the voltage supply terminal $V_{cc}$. A second resistance R7 is connected between the collector of the phase splitter transistor Q6 and the voltage supply terminal $V_{cc}$. A third resistance R8 is connected between the base and emitter of the pull-down output transistor Q8. A fourth resistance R9 is connected between the collector of the pull-up output transistor Q9 and the voltage supply terminal $V_{cc}$.

The circuit includes a data input terminal 20, a data output terminal 22, a circuit disable terminal 24 and a circuit control terminal 26. An inverter 28 couples the circuit control terminal 26 to the circuit disable terminal 24. A first diode D2 has its anode connected to the collector of the phase splitter transistor Q7 and its cathode connected to the circuit disable terminal 24. A second diode D3 has its anode connected to the collector of the phase splitter transistor Q7 and its cathode connected to the collector of the pull-up output transistor Q9.

The input transistor Q6 has a first emitter connected to the data input terminal 20 for receiving a digital data input signal and a second emitter connected to the circuit disable terminal 24. The phase splitter transistor Q12 has its base coupled to the collector of the input transistor Q6. The second current mirror transistor Q12 has its base and emitter respectively connected to the base and emitter of the phase splitter transistor Q7 and its collector connected to the voltage supply terminal $V_{cc}$.

The pull-down output transistor Q8 has its base coupled to the emitter of the phase splitter transistor Q7, its emitter coupled to a circuit ground terminal, and its collector connected to the data output terminal 22. The pull-up output transistor Q9 has its emitter connected to the data output terminal 22, its collector coupled to the voltage supply terminal $V_{cc}$, and its base coupled to the collector of the phase splitter transistor Q7. The current amplifying transistor Q11 has its emitter connected to the base of the pull-up output transistor Q9, its base connected to the collector of the phase splitter transistor Q7 and its collector connected to the voltage supply terminal $V_{cc}$.

The circuit is disabled when a "high" logic signal is applied to the circuit control terminal 26, whereby the inverter 28 causes a "low" logic level signal to be applied at the circuit disable terminal 24. When a "low" logic signal is applied at the circuit disable terminal 24, the circuit has a high output impedance between the data output terminal 22 and circuit ground to inhibit the provision of a digital data output signal at the data output terminal 22.

When a "high" logic signal is applied at the circuit disable terminal 24, a digital data output signal that is the logical complement of the digital data input signal at input terminal 20 is provided at the data output terminal 22.

The tristate logic buffer circuit of FIG. 2 is characterized by a current mirror transistor Q10 having its base and emitter respectively connected to the base and emitter of the pull-up output transistor Q9 and its collector connected to the supply voltage terminal $V_{cc}$. The ratio of the emitter size of the second current mirror transistor to the emitter size of the pull-up output transistor is scaled in accordance with how much current is required to drive the pull-up output transistor Q9.

The addition of the current mirror transistor Q10 enhances the dynamic response of the pull-up output transistor Q9 in providing a "high" logic level in the digital data output signal at the data output terminal 22. Whereas there is a Miller feedback effect on the pull-up output transistor Q9, which has its collector coupled to the supply voltage terminal $V_{cc}$ through the resistance R9; there is minimal Miller feedback effect upon the current mirror transistor Q10 which has its collector connected directly to the voltage supply terminal $V_{cc}$.

Thus upon the onset of a positive transition in the signal at the bases of the transistors Q9, Q10, the current ratio between the current mirror transistor Q10 and the pull-up output transistor Q9 is even greater than the ratio of their respective emitter sizes and the dynamic response of the pull-up output transistor in providing a "high" logic level in the digital data output signal at the data output terminal 22 is enhanced.

The second current mirror transistor Q12 supplements the drive current that is provided by the phase splitter transistor Q7 to the pull-down transistor Q8 and thereby enables the resistance R7 that is connected between the voltage supply terminal $V_{cc}$ and the collector of the phase splitter transistor Q7 to be high without diminishing the drive current to the pull-down output transistor Q9. By connecting a high resistance R7 between the voltage supply terminal $V_{cc}$ and the collector of the phase splitter transistor Q7, and the current flow through the phase splitter transistor Q7 and resultant power consumption are reduced when the circuit is in its disabled state. The ratio of the size of the emitter of the second current mirror transistor Q12 to the size of the emitter of the phase splitter transistor Q7 is scaled in accordance with how much current is required to drive the pull-down output transistor Q8.

The feature of including the second current mirror transistor in a tristate logic buffer circuit, such as is shown in FIG. 2, is reserved as the subject of a separate patent application by Dale Allen Mrazek, one of the named co-inventors herein.

Figure 1:
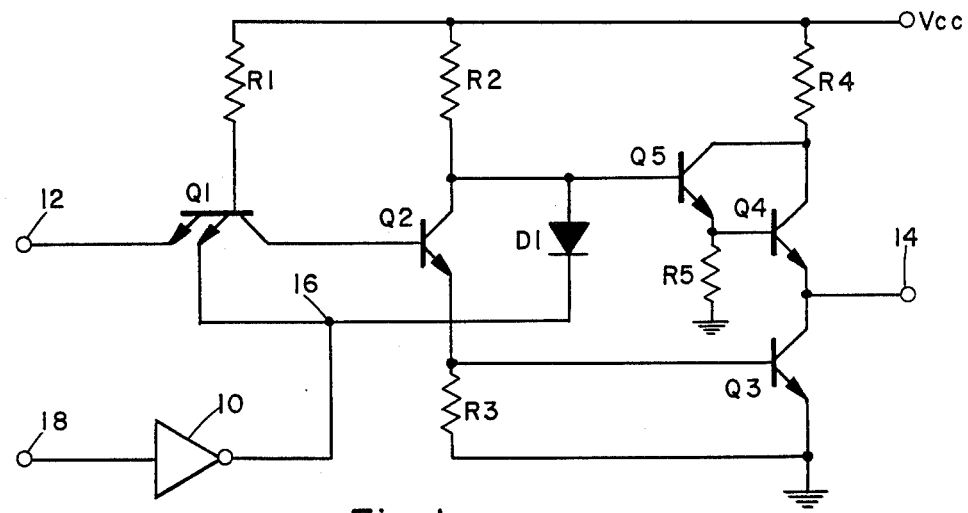
FIG. 1 is a schematic circuit diagram of a prior art tristate logic buffer circuit.

As mentioned previously, the collector of the current amplifying transistor Q11 is connected directly to the voltage supply terminal $V_{cc}$, instead of to the collector of the pull-up output transistor Q9 as in the prior art tristate logic buffer circuit discussed in relation to FIG. 1. This feature reduces the dynamic capacitance at the node 30 at which the base of the current amplifying transistor Q11 is connected to the collector of the phase splitter transistor Q7. As a result the transition to a positive voltage at the node 30 is faster.

The second diode D3 protects the circuit from burnout in the event that the output terminal 22 is inadvertently connected directly to circuit ground potential. The diode D3 is a Schottky diode. Alternatively the diode D3 may be a diffused diode.

The input transistor Q6, the phase splitter transistor Q7 and the second current mirror transistor Q12 are Schottky transistors so as to assure their respective operations in a linear mode. Alternatively any or all of these transistors may be a diffused transistor having a diode connected between its base and collector, with the anode of the diode being connected to the base of the transistor.

We claim:
1. A tristate logic buffer circuit, comprising
   a data input terminal;
   a multi-emitter input transistor, having a first emitter connected to the data input terminal for receiving a digital data input signal;
   a voltage supply terminal;
   a phase splitter transistor having its base coupled to the collector of the input transistor;
   a data output terminal;
   a pull-down output transistor having its base coupled to the emitter of the phase splitter transistor, its emitter coupled to a circuit ground terminal, and its collector connected to the data output terminal;

a pull-up output transistor having its emitter connected to the data output terminal and its base coupled to the collector of the phase splitter transistor;

a resistance for coupling the collector of the pull-up output transistor to the voltage supply terminal;

a circuit disable terminal connected to a second emitter of the input transistor; and a diode having its anode connected to the collector of the phase splitter transistor and its cathode connected to the circuit disable terminal;

wherein, when a "high" logic signal is applied at the circuit disable terminal, a digital data output signal that is the logical complement of the digital data input signal is provided at the data output terminal; and when a "low" logic signal is applied at the circuit disable terminal, the circuit has a high output impedance between the data output terminal and circuit ground to inhibit the provision of said digital data output signal;

wherein the improvement comprises a current mirror transistor having its base and emitter respectively connected to the base and emitter of the pull-up output transistor and its collector connected to the voltage supply terminal for enhancing the dynamic response of the pull-up output transistor in providing a "high" logic level in the digital data output signal.

2. A tristate logic buffer circuit, comprising a data input terminal;

a multi-emitter input transistor, having a first emitter connected to the data input terminal for receiving a digital data input signal;

a voltage supply terminal;

a first resistance for coupling the base of the input transistor to the voltage supply terminal;

a phase splitter transistor having its base coupled to the collector of the input transistor;

a second resistance for coupling the collector of the phase splitter transistor to the voltage supply terminal;

a data output terminal;

a pull-down output transistor having its base coupled to the emitter of the phase splitter transistor, its emitter coupled to a circuit ground terminal, and its collector connected to the data output terminal;

a third resistance coupled between the base and emitter of the pull-down output transistor;

a pull-up output transistor having its emitter connected to the data output terminal and its base coupled to the collector of the phase splitter transistor;

a fourth resistance for coupling the collector of the pull-up output transistor to the voltage supply terminal;

a circuit disable terminal connected to a second emitter of the input transistor; and a diode having its anode connected to the collector of the phase splitter transistor and its cathode connected to the circuit disable terminal;

wherein, when a "high" logic signal is applied at the circuit disable terminal, a digital data output signal that is the logical complement of the digital data input signal is provided at the data output terminal; and when a "low" logic signal is applied at the circuit disable terminal the circuit has a high output impedance between the data output terminal and circuit ground to inhibit the provision of said digital data output signal;

wherein the circuit further comprises a current mirror transistor having its base and emitter respectively connected to the base and emitter of the pull-up output transistor and its collector connected to the voltage supply terminal for enhancing the dynamic response of the pull-up output transistor in providing a "high" logic level in the digital data output signal; and a second current mirror transistor having its base and emitter respectively connected to the base and emitter of the phase splitter transistor and its collector connected to the voltage supply terminal.

* * * * *